United States Patent
Jung et al.

(10) Patent No.: US 7,297,595 B2
(45) Date of Patent: Nov. 20, 2007

(54) NON-VOLATILE MEMORY DEVICE AND FABRICATING METHOD THEREOF

(75) Inventors: Sung Mun Jung, Kyunggido (KR); Jum Soo Kim, Kyunggido (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/019,304

(22) Filed: Dec. 23, 2004

(65) Prior Publication Data
US 2005/0139900 A1    Jun. 30, 2005

(30) Foreign Application Priority Data
Dec. 27, 2003   (KR) .................. 10-2003-0098355

(51) Int. Cl.
*H01L 21/336* (2006.01)
(52) U.S. Cl. .................. 438/259; 438/267; 438/596
(58) Field of Classification Search ................ 438/257, 438/259, 267, 596
See application file for complete search history.

(56) References Cited

U.S. PATENT DOCUMENTS

| | | | |
|---|---|---|---|
| 6,403,421 B1 * | 6/2002 | Ikeda et al. ........... | 438/267 |
| 6,743,675 B2 * | 6/2004 | Ding ..................... | 438/257 |
| 6,838,342 B1 * | 1/2005 | Ding ..................... | 438/257 |
| 6,884,679 B2 * | 4/2005 | Park et al. ............. | 438/257 |
| 6,911,370 B2 * | 6/2005 | Wang et al. ........... | 438/315 |
| 2005/0224860 A1 * | 10/2005 | Hendriks et al. ...... | 257/315 |

OTHER PUBLICATIONS

Edward S. Yang, "Microelectronic Devices", McGraw-Hill Book Company, 1988, pp. 341-353.*

* cited by examiner

*Primary Examiner*—Trung Dang
(74) *Attorney, Agent, or Firm*—Sherr & Nourse, PLLC

(57) ABSTRACT

The present invention provides a non-volatile memory device and fabricating method thereof, in which a height of a floating gate conductor layer pattern is sustained without lowering a degree of integration and by which a coupling ratio is raised. The present invention includes a trench type device isolation layer defining an active area within a semiconductor substrate, a recess in an upper part of the device isolation layer to have a prescribed depth, a tunnel oxide layer on the active area of the semiconductor substrate, a floating gate conductor layer pattern on the tunnel oxide layer, a conductive floating spacer layer provided to a sidewall of the floating gate conductor layer pattern and a sidewall of the recess, a gate-to-gate insulating layer on the floating fate conductor layer pattern and the conductive floating spacer layer, and a control gate conductor layer on the gate-to-gate insulating layer.

6 Claims, 3 Drawing Sheets

NON-VOLATILE MEMORY DEVICE AND FABRICATING METHOD THEREOF

This application claims the benefit of the Korean Application No. P2003-0098355 filed on Dec. 27, 2003, which is hereby incorporated by reference.

BACKGROUND OF THE INVENTION

1. Field of the Invention

The present invention relates to a non-volatile memory device and fabricating method thereof, and more particularly, to a non-volatile memory device having a high coupling ratio and fabricating method thereof.

2. Discussion of the Related Art

Generally, semiconductor memory devices are categorized into a volatile memory device, which loses data in case of cutting off power supply, such as DRAM (dynamic random access memory) and SRAM (static random access memory) and a non-volatile memory device, which saves data in spite of cutting off power supply, such as a flash memory device.

FIG. 1 is a cross-sectional diagram of a non-volatile memory device according to a related art.

Referring to FIG. 1, a tunnel oxide layer pattern 106 and a floating gate conductor layer pattern 108 are sequentially stacked on an active area 104 of a semiconductor substrate 100 defined by a device isolation layer 102.

A gate-to-gate insulating layer 110 is formed on the floating gate conductor layer pattern 108 and the device isolation layer 102. The gate-to-gate insulating layer 110 consists of an oxide/nitride/oxide (ONO) layer.

And, a control gate conductor layer 112 is arranged on the gate-to-gate insulating layer 110.

In operating the above-configured non-volatile memory device, a ratio of voltage coupled to the floating gate conductor layer pattern 108 by a voltage applied to the control gate conductor layer 112 is called a coupling ratio. And, it is well known that the speed and performance of the device are enhanced by high coupling ratio. The coupling ratio can be expressed by Equation 1.

$$\gamma = \frac{C_{ONO}}{C_{ONO} + C_{tunnel}} \quad \text{[Equation 1]}$$

In Equation 1, $C_{ONO}$ is capacitance between the floating gate conductor layer pattern 108 and the control gate conductor layer patter 112 and $C_{tunnel}$ is capacitance between the floating gate conductor layer pattern 108 and a bulk, i.e., channel.

As can be known by Equation 1, $C_{ONO}$ should be increased to raise the coupling ratio. For this, a contact area between the floating gate conductor layer pattern 108 and the gate-to-gate insulating layer 110 needs to be increased.

However, if a width of the active area is increased to increase the contact area between the floating gate conductor layer pattern 108 and the gate-to-gate insulating layer 110, the degree of device integration is lowered.

In case a height of the floating gate conductor layer pattern 108 is raised, it is difficult to carryout an etch process thereof.

SUMMARY OF THE INVENTION

Accordingly, the present invention is directed to a non-volatile memory device and fabricating method thereof that substantially obviate one or more problems due to limitations and disadvantages of the related art.

An object of the present invention is to provide a non-volatile memory device and fabricating method thereof, in which a height of a floating gate conductor layer pattern is sustained without lowering a degree of integration and by which a coupling ratio is raised.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a non-volatile memory device according to the present invention includes a semiconductor substrate, a trench type device isolation layer defining an active area within the semiconductor substrate, a recess in an upper part of the device isolation layer to have a prescribed depth, a tunnel oxide layer on the active area of the semiconductor substrate, a floating gate conductor layer pattern on the tunnel oxide layer, a conductive floating spacer layer provided to a sidewall of the floating gate conductor layer pattern and a sidewall of the recess of the device isolation layer, a gate-to-gate insulating layer on the floating fate conductor layer pattern and the conductive floating spacer layer, and a control gate conductor layer on the gate-to-gate insulating layer.

Preferably, the depth of the recess is 300~2,000 Å.

Preferably, the floating conductor layer pattern and the conductive floating spacer layer are formed of polysilicon.

Preferably, the gate-to-gate insulating layer is an oxide/nitride/oxide stacked layer.

In another aspect of the present invention, a method of fabricating a non-volatile memory device includes the steps of forming a trench type device isolation layer defining an active area within a semiconductor substrate, forming a tunnel oxide layer on the active area of the semiconductor substrate, forming a floating gate conductor layer on the tunnel oxide layer and the device isolation layer, forming a floating fate conductor layer pattern exposing a portion of the device isolation layer by pattering the floating gate conductor layer, forming a recess in an upper part of the device isolation layer by removing the exposed portion of the device isolation layer to a prescribed depth, forming a conductive floating spacer layer on a sidewall of the floating gate conductor layer pattern and a sidewall of the recess of the device isolation layer, forming a gate-to-gate insulating layer on the floating fate conductor layer pattern and the conductive floating spacer layer, and forming a control gate conductor layer on the gate-to-gate insulating layer.

Preferably, the floating gate conductor layer pattern and the recess of the device isolation layer are formed by one etch process using a same mask layer pattern as an etch mask.

Preferably, the depth of the recess is 300~2,000 Å.

Preferably, the conductive floating spacer layer forming step comprising the steps of forming a floating space conductor layer on the sidewalls of the floating gate conductor layer pattern and the recess of the device isolation layer and anisotropically etching the floating spacer conductor layer to expose an upper surface of the floating gate conductor layer pattern.

More preferably, the floating spacer conductor layer is anisotropically etched by etchback.

Preferably, the gate-to-gate insulating layer comprises an oxide/nitride/oxide stacked layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
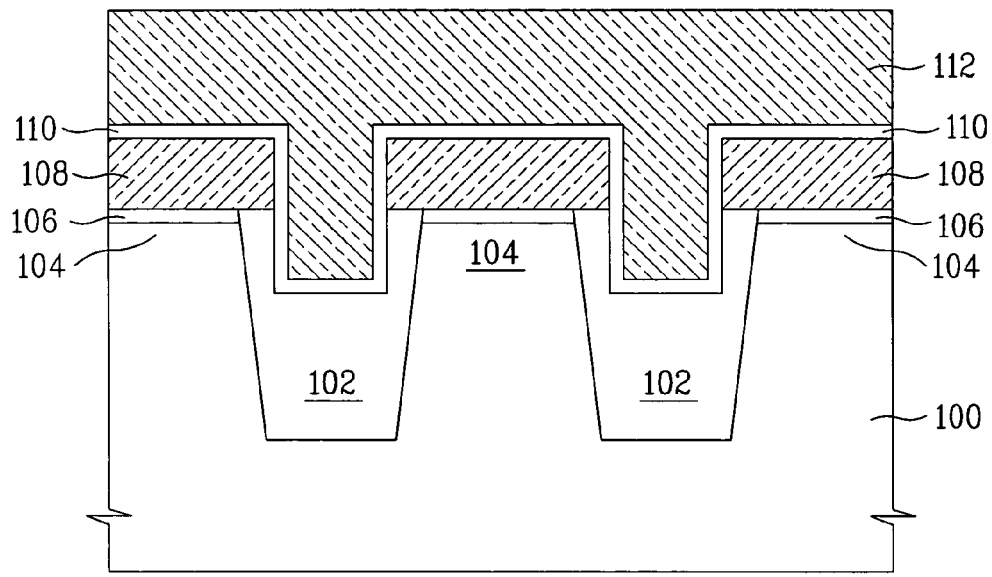
FIG. 1 is a cross-sectional diagram of a non-volatile memory device according to a related art.
Figure 2:
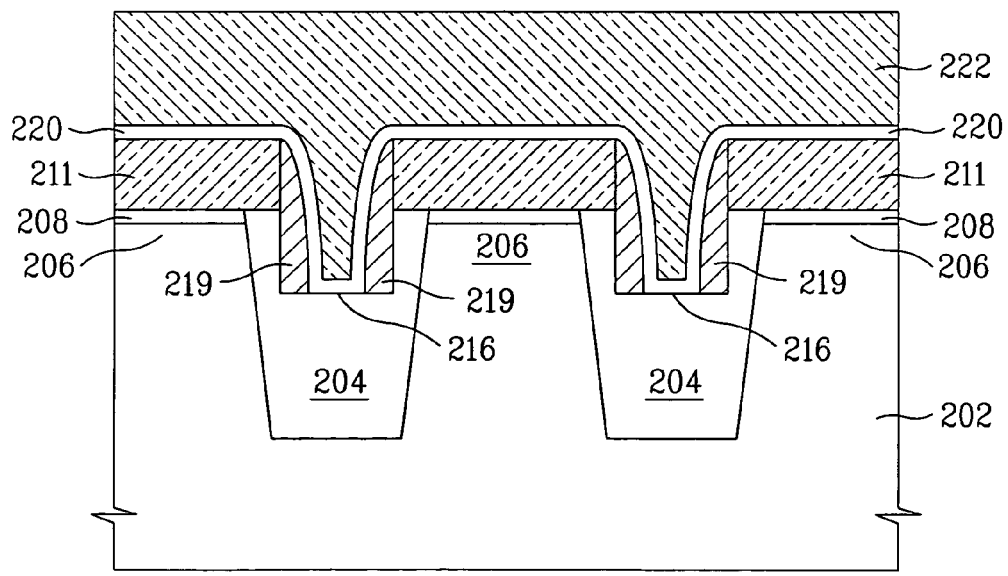
FIG. 2 is a cross-sectional diagram of a non-volatile memory device according to the present invention.

FIG. 2 is a cross-sectional diagram of a non-volatile memory device according to the present invention.

Referring to FIG. 2, a tunnel oxide layer pattern 208 is arranged on an active area 206 of a semiconductor substrate 202 defined by a device isolation layer 204.

The device isolation layer 104 has a trench shape and a recess 216 having a prescribed depth is formed on a top of the device isolation layer 204. And, the depth of the recess 216 is about 300~2,000 Å.

A floating gate conductor layer pattern 211 is arranged on the tunnel oxide layer 208.

A conductive gate spacer layer 219 is provided to sidewalls of the floating gate conductor layer pattern 211 and the recess 216 of the device isolation layer 204. Both of the floating gate conductor layer pattern 211 and the conductive gate spacer layer 219 play a role as a floating gate. Both of the floating gate conductor layer pattern 211 and the conductive gate spacer layer 219 may be formed of polysilicon.

An ONO (oxide/nitride/oxide) layer 220 is arranged on the floating gate conductor layer pattern 211 and the conductive gate spacer layer 219.

A control gate conductor layer 22 is arranged on the ONO layer 220. And, the control gate conductor layer 22 can be formed of polysilicon as well.

In the above-configured non-volatile memory device, by providing the conductive gate spacer layer 219 to the sidewall of the floating gate conductor layer pattern 211 and the sidewall of the recess 219 of the device isolation layer 204 and by forming the ONO layer 220 as the gate-to-gate insulating layer on the conductive gate spacer layer 219, the contact area between the ONO layer 220 operative as the gate-to-gate insulating layer and both of the floating gate conductor layer pattern 211 and the conductive gate spacer layer 219 operative as the floating gate can be increased, whereby the coupling ratio of the device is raised.

FIGS. 3 to 6 are cross-sectional diagrams for explaining a method of fabricating a non-volatile memory device according to the present invention.

Figure 3:
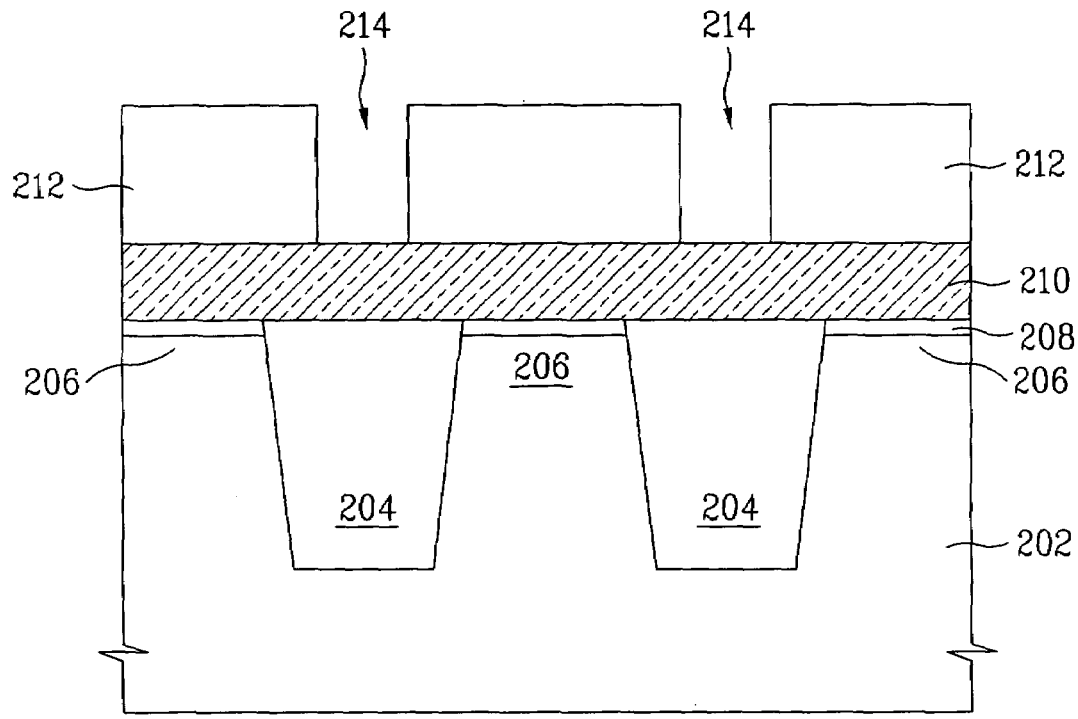
FIGS. 3 to 6 are cross-sectional diagrams for explaining a method of fabricating a non-volatile memory device according to the present invention.

Referring to FIG. 3, a device isolation layer 204 is formed in a semiconductor substrate 202 to define an active area 206. The device isolation layer 204 is formed to have a general trench shape.

A thin tuner oxide layer 208 is formed on the active area 206.

A floating gate conductor layer 210 is formed on the tunnel oxide layer 208. The floating gate conductor layer 210 is formed using a polysilicon layer.

A mask layer pattern 212 is formed on the floating gate conductor layer 210. The mask layer pattern 212 is formed using a photoresist pattern. And, the mask layer pattern 212 has an opening 214 exposing a portion of the floating gate conductor layer 210.

Figure 4:
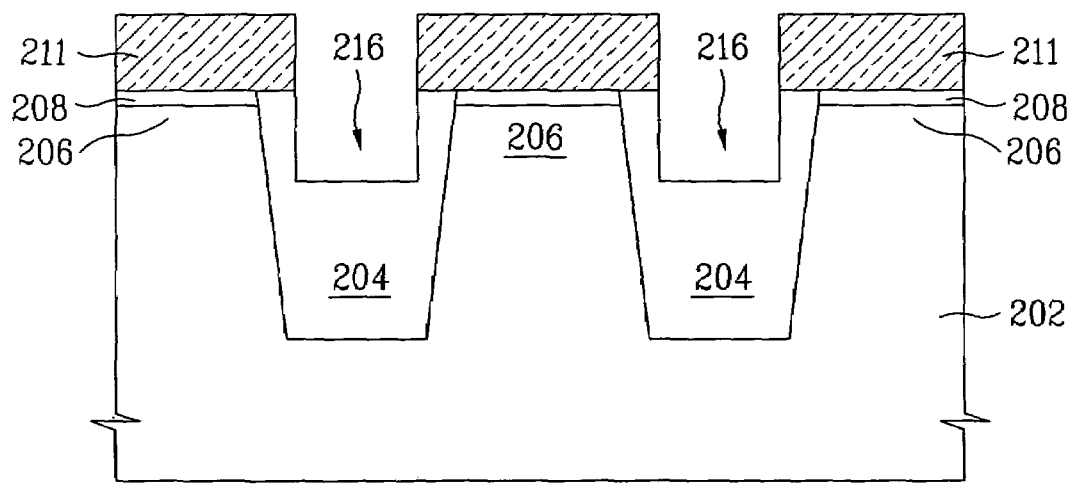

Referring to FIG. 4, a floating gate conductor layer pattern 211 is formed by etching the exposed portion of the floating gate conductor layer 210 using the mask layer pattern 212 as an etch mask.

An exposed portion of the device isolation layer 204 is etched after forming the floating conductive layer pattern 211, whereby a recess 216 having a prescribed depth of 300~2,000 Å is formed.

After forming the recess 216, the mask layer pattern is removed.

Figure 5:
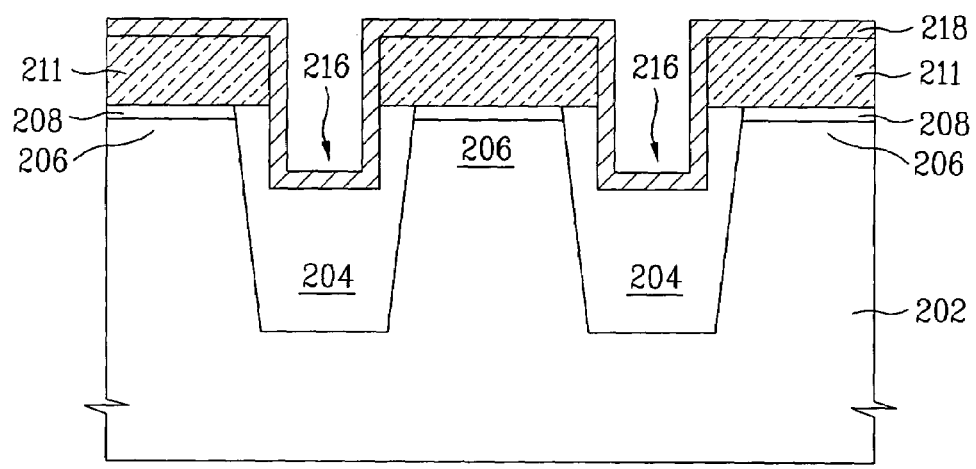

Referring to FIG. 5, a floating spacer conductor layer 218 is formed on exposed surfaces of the floating gate conductor layer pattern 21 and the device isolation layer 204. In doing so, the floating spacer conductor layer 218 can be formed of polysilicon.

Figure 6:
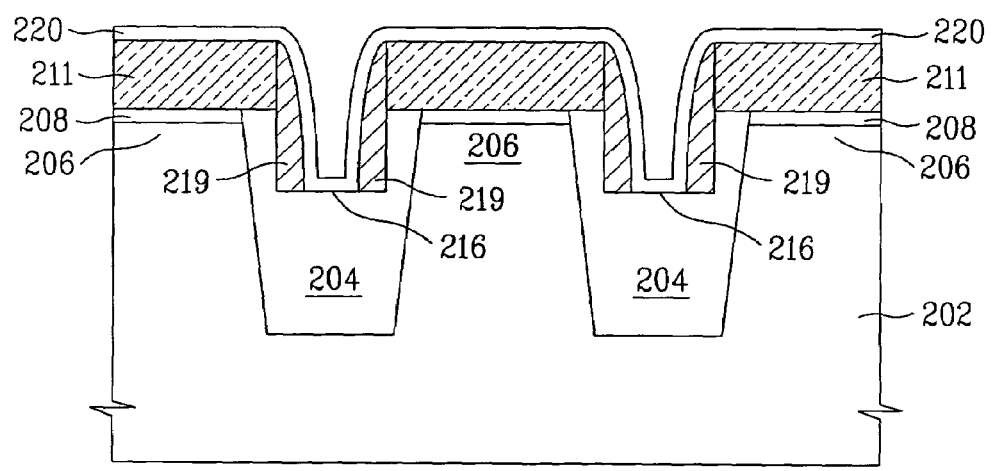

Referring to FIG. 6, anisotropic etch is carried out on the floating spacer conductor layer 218 to form a conductive floating spacer layer 219 on a sidewall of the floating gate conductor layer pattern 211 and a sidewall of the recess 216 of the device isolation layer 204. The anisotropic etch is carried out in a manner of performing etch-back until an upper surface of the floating gate conductor layer pattern 211 is exposed.

Subsequently, an ONO layer 220 is formed as a gate-to-gate insulating layer on the floating gate conductor layer pattern 211 and the conductive floating spacer layer 219.

Thereafter, a control gate conductor layer 222 is formed on the ONO layer 220 using polysilicon.

Accordingly, by forming the recess having the prescribed depth in the device isolation layer and by forming the conductive floating spacer layer to the sidewall of the recess and the sidewall of the floating gate conductor layer pattern, the present invention enables both of the floating gate conductor layer pattern and the floating spacer layer to operate as the floating gate.

Therefore, the present invention extends the contact area between the floating gate and the gate-to-gage insulating layer to raise the coupling ratio, thereby enhancing the device performance.

Moreover, the present invention facilitates to fabricate the non-volatile memory device having the raised coupling ratio.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a non-volatile memory device, comprising the steps of:

forming a trench type device isolation layer defining an active area within a semiconductor substrate;

forming a tunnel oxide layer only on the active area of the semiconductor substrate;

forming a floating gate conductor layer on the tunnel oxide layer and the device isolation layer;

forming a floating gate conductor layer pattern exposing a portion of the device isolation layer by patterning the floating gate conductor layer;

forming a recess in an upper part of the device isolation layer by removing the exposed portion of the device isolation layer;

forming a conductive floating spacer layer on a sidewall of the floating gate conductor layer pattern and a sidewall of the recess of the device isolation layer;

anisotropic etching the conductive floating spacer layer to expose an upper conductive surface of the floating gate conductor layer pattern;

forming a gate-to-gate insulating layer on the floating gate conductor layer pattern and the conductive floating spacer layer; and forming a control gate conductor layer on the gate-to-gate insulating layer.

2. The method of claim 1, wherein the floating gate conductor layer pattern and the recess of the device isolation layer are formed by one etch process using a same mask layer pattern as an etch mask.

3. The method of claim 1, the conductive floating spacer layer forming step comprising the steps of:

forming a floating space conductor layer on the sidewalls of the floating gate conductor layer pattern and the recess of the device isolation layer; and anisotropically etching the floating spacer conductor layer to expose an upper surface of the floating gate conductor layer pattern.

4. The method of claim 3, wherein the floating spacer conductor layer is anisotropically etched by etchback.

5. The method of claim 1, wherein the gate-to-gate insulating layer comprises an oxide/nitride/oxide stacked layer.

6. The method of claim 1, wherein the depth of the recess is between approximately 300 Å and approximately 2,000 Å.

* * * * *